United States Patent [19]

Ruckert

[11] Patent Number: 4,506,006

[45] Date of Patent: Mar. 19, 1985

[54] PROCESS FOR PREPARING RELIEF IMAGES IN IMAGED IRRADIATED LIGHT-SENSITIVE MATERIAL HAVING ACID-CLEAVABLE COMPOUND BY HOT AIR TREATMENT, OVERALL IRRADIATION AND ALKALINE DEVELOPMENT

[75] Inventor: Hans Ruckert, Wiesbaden, Fed. Rep. of Germany

[73] Assignee: Hoechst Aktiengesellschaft, Frankfurt am Main, Fed. Rep. of Germany

[21] Appl. No.: 449,739

[22] Filed: Dec. 14, 1982

[30] Foreign Application Priority Data

Dec. 23, 1981 [DE] Fed. Rep. of Germany ....... 3151078

[51] Int. Cl.$^3$ ............................ G03C 7/26; G03C 7/00
[52] U.S. Cl. ......................................... 430/325; 430/5; 430/165; 430/189; 430/192; 430/269; 430/270; 430/272; 430/275; 430/277; 430/278; 430/258; 430/302; 430/306; 430/307; 430/308; 430/311; 430/315; 430/318; 430/326; 430/328; 430/330
[58] Field of Search ............... 430/325, 326, 328, 330, 430/189, 270, 269

[56] References Cited

U.S. PATENT DOCUMENTS

| | | | |
|---|---|---|---|
| 3,126,281 | 3/1964 | Sus et al. | 430/191 |
| 3,264,104 | 8/1966 | Reichel | 96/33 |
| 3,406,065 | 10/1968 | Uhlig | 96/33 |
| 3,515,552 | 6/1970 | Smith | 430/325 |
| 3,536,489 | 10/1970 | Smith | 430/270 |
| 3,779,778 | 12/1973 | Smith et al. | 96/115 R |
| 3,915,706 | 10/1975 | Limburg et al. | 96/27 R |
| 4,101,323 | 7/1978 | Buhr et al. | 96/35 |
| 4,108,664 | 8/1978 | de Boer et al. | 430/191 |
| 4,189,323 | 2/1980 | Buhr | 430/281 |
| 4,196,003 | 4/1980 | Watanabe | 430/191 |
| 4,247,611 | 1/1981 | Sander et al. | 430/286 |
| 4,248,957 | 2/1981 | Sander et al. | 430/270 |
| 4,250,247 | 2/1981 | Sander et al. | 430/270 |
| 4,311,782 | 1/1982 | Buhr et al. | 430/270 |
| 4,356,254 | 10/1982 | Takahashi et al. | 430/325 |
| 4,356,255 | 10/1982 | Tackikawa et al. | 430/325 |
| 4,387,152 | 6/1983 | Stahlhofen | 430/191 |
| 4,421,844 | 12/1983 | Buhr et al. | 430/330 |

FOREIGN PATENT DOCUMENTS 0024916 3/1981 European Pat. Off. .

Primary Examiner—Charles L. Bowers, Jr.
Attorney, Agent, or Firm—Schwartz, Jeffery, Schwaab, Mack, Blumenthal & Koch

[57] ABSTRACT

A process is described for preparing relief images, in which a light-sensitive material composed of a support and a light-sensitive layer which contains as essential constituents (a) a compound which has at least one C-O-C bond which is cleavable by acid, (b) a compound which forms a strong acid on irradiation and (c) a binder which is insoluble in water and soluble in aqueous-alkaline solutions is imagewise irradiated, warmed to an elevated temperature, cooled down and then irradiated over its entire area, whereafter those parts of the layer which have not been imagewise irradiated are then washed out by developing. The process makes it possible to prepare positive or negative copies by means of the same light-sensitive material in a simple way.

10 Claims, No Drawings

PROCESS FOR PREPARING RELIEF IMAGES IN IMAGED IRRADIATED LIGHT-SENSITIVE MATERIAL HAVING ACID-CLEAVABLE COMPOUND BY HOT AIR TREATMENT, OVERALL IRRADIATION AND ALKALINE DEVELOPMENT

BACKGROUND OF THE INVENTION

The present invention relates to a process for preparing relief images, and more especially to such a process in which a light-sensitive material composed of a support and a light-sensitive layer is imagewise irradiated and the non-image areas are washed out with a developer liquid. The light-sensitive layer contains as essential constituents (a) a compound which has at least one C—O—C bond which is cleavable by acid, (b) a compound which forms a strong acid on irradiation, and (c) a binder which is insoluble in water and soluble in aqueous-alkaline solutions.

Processes of the generic type mentioned and the light-sensitive materials used in these processes are known. These materials produce positive copies of the exposure original, i.e., the layer becomes soluble in a developer at the exposed areas. Such positive-working materials are described in U.S. Pat. Nos. 3,779,778, 4,101,323, 4,189,323, 4,247,611, 4,250,247, 4,248,957 and 4,311,782. On exposure of these materials, compound (b) forms an acid by photolysis, and the acid cleaves the C—O—C groups of compound (a), so that as a result, the exposed areas of the light-sensitive layers become soluble in a developer.

It is also known to apply a certain sequence of treatment steps in order to process in a negative manner a positive-working reproduction material based on 1,2-naphthoquinonediazides. U.S. Pat. No. 3,264,104 describes such a reverse process, in which the light-sensitive layer, which preferably contains thermoplastic polymers, is imagewise exposed, treated with an alkaline solution or with hot water, without washing out the exposed areas, then re-exposed without the original and subsequently developed in the customary manner. In the developing procedure, the originally imagewise exposed areas are left intact, while the remaining areas are washed out.

A similar process is described in U.S. Pat. No. 3,406,065. In this process also, a layer of the same type is imagewise exposed, treated with aqueous alkali without washing out the exposed areas, then treated with an alkali-resistant lacquer and developed by washing out those areas not imagewise exposed. The developing can be effected either with organic solvents or with aqueous-alkaline solutions, the case where the layer was exposed without the original after the first alkali treatment and before the lacquering.

These processes have the disadvantages (1) that they require a relatively large number of treatment steps, (2) that the first alkali treatment must always be carried out with particular care in order to release as little as possible of the exposed layer, which is soluble in aqueous alkali, (3) that they require the addition of polymers which are sparingly soluble in alkali and restrict the utilizability of the material for other purposes, or (4) that they also require lacquering of the expose layer. Any material based on 1,2-naphthoquinonediazides has the disadvantage in principle of a relatively low light sensitivity.

European patent application No. 24,916 discloses a similar reverse process, in which a material based on 1,2-quinonediazides is heated after imagewise exposure, then re-exposed without the original and developed by means of aqueous alkali to give a negative. The material contains in the light-sensitive layer certain photochromic compounds which react during heating with the light reaction products of quinonediazide and which are said to lead to a hardening of the layer. This material requires the presence of photochromic substances, the light reaction of which produces a discoloration which is troublesome in some applications. It also has the low light sensitivity characteristic of 1,2-quinonediazides.

SUMMARY OF THE INVENTION

It is therefore an object of the present invention to provide an improved reverse process for preparing negative copies by means of a normally positive-working light-sensitive material.

It is a particular object of the invention to provide such a process which enables a higher light sensitivity and a simpler execution compared to known reverse processes.

In accomplishing the foregoing objects, there has been provided in accordance with the present invention a process for preparing relief images, comprising the steps of imagewise irradiating a light-sensitive material composed of a support and a light-sensitive layer which comprises (a) a compound which has at least one C—O—C bond which is cleavable by acid, (b) a compound which forms a strong acid on irradiation, and (c) a binder which is insoluble in water and soluble in aqueous-alkaline solutions to produce imaged and non-imaged areas; warming the irradiated material to an elevated temperature sufficient to render the imaged areas resistant to developing; bringing the material to a lower temperature; uniformly irradiating the entire area of the layer; and selectively developing the non-imaged areas from the imagewise irradiating step.

According to another embodiment of the invention, the process further comprises the steps of imagewise irradiating, according to a first pattern, a light-sensitive material composed of a support and a light-sensitive layer which comprises (a) a compound which has at least one C—O—C bond which is cleavable by acid, (b) a compound which forms a strong acid on irradiation, and (c) a binder which is insoluble in water and soluble in aqueous-alkaline solutions, developing the irradiated layer to produce bared areas in the regions of irradiation; modifying said bared areas to provide a metal surface; before or after said modification, imagewise irradiating the remaining areas of the layer according to a second pattern; warming the irradiated material to an elevated temperature sufficient to render the imaged areas resistant to developing; bringing the material to a lower temperature; uniformly irradiating said remaining layer areas; and, after said modification, developing said remaining layer areas to remove the non-irradiated areas of said second imagewise irradiation. Preferably, the pattern used in the first imagewise irradiation comprises the pattern for the second imagewise irradiation, which is partially covered.

Further objects, features and advantages of the invention will become apparent from the detailed description of preferred embodiments which follows.

DETAILED DESCRIPTION OF PREFERRED EMBODIMENTS

In the process according to the invention, the light-sensitive material is warmed to an elevated temperature after imagewise irradiation, cooled down and then irradiated over its entire area, and those areas which have not been irradiated imagewise are developed by washing out.

As compounds which have acid-cleavable C—O—C bonds, the light-sensitive mixture used for preparing the light-sensitive material can contain, inter alia, monomeric and polymeric acetals, monomeric and polymeric orthocarboxylates, enol-ethers, and N-acyliminocarbonates. Mixtures of this type are described in the U.S. patents which are mentioned in the introduction. Polymeric acetals and orthocarboxylates are particularly preferred for this use. The proportion of acid-cleavable compound is in general from about 9 to 75%, preferably from about 15 to 50% by weight, relative to the non-volatile constituents of the light-sensitive layer.

A large number of known compounds and mixtures are suitable for use as the radiation-sensitive components which, upon irradiation, preferentially form or split-off strong acids. Such compounds are, e.g., diazonium, phosphonium, sulfonium and iodonium salts, halogen compounds, o-quinonediazide sulfochlorides and organometal/organohalogen combinations.

Possible diazonium salts are those compounds which are known in diazotype and have a utilizable absorption between about 300 and 600 nm. Those compounds are preferable which do not contain basic substituents.

As a rule, the onium salts mentioned are used in the form of their salts which are soluble in organic solvents, usually as a precipitate with complex acids such as tetrafluoroboric acid or hexafluorophosphoric, hexafluoroantimonic or hexafluoroarsenic acid.

Sulfonyl halides of positive-working o-quinonediazides can also be used.

As the halogen-containing radiation-sensitive compounds which form hydrohalogenic acid, it is possible to use in principle any organic halogen compound which is also known as a photochemical free-radical initiator, for example, those which have more than one halogen atom on a carbon atom or in an aromatic ring. Examples have been described in U.S. Pat. Nos. 3,515,552, 3,536,489 and 3,779,778, German Auslegeschrift No. 2,610,842 and German Offenlegungsschriften Nos. 2,718,259 and 2,243,621.

The amount of the initiator can also vary widely according to the chemical nature of the initiator and the composition of the mixture. Favorable results are obtained using from about 0.1 to 10% by weight, relative to total solids, with from about 0.2 to 5% being preferable. It is advisable to use a relatively small amount of acid donor, especially for copying layers which are more than 10 μm thick.

Preferably, the mixtures also contain a polymeric binder which is preferably insoluble in water and soluble in organic solvents. Since aqueous-alkaline solutions can advantageously be used as developer liquids for the exposed copying layers, and these aqueous-alkaline solutions are generally preferred over developers based on organic solvents, in particular, those binders are preferable which are soluble, or at least swellable, in aqueous alkalis.

The type and amount of water-insoluble binders can vary according to the intended use. Proportions of total solids between about 30 and 90%, in particular between about 55 and 85% by weight, are preferable.

Phenolic resins, above all novolaks, which have proved themselves in the case of many positive copying materials, have been found to be particularly advantageous in this case also. The novolaks may also be modified in a known manner by reacting some of their hydroxyl groups with, for example, chloroacetic acid, isocyanates, epoxides or carboxylic anhydrides. Other alkali-soluble resins, such as copolymers of maleic anhydride and styrene, vinyl acetate and crotonic acid, methyl methacrylate and methacrylic acid and the like, are also suitable for use as binders.

Numerous other resins can also be used in addition, and they can be either water-soluble or alkali-insoluble, for example, polyvinyl acetates, polyurethanes, polyacrylates, polyvinyl ethers and polyvinylpyrrolidones, which in turn can be modified by comonomers, and hydrogenated or partially hydrogenated colophony derivatives. The most preferable content of these resins in the mixture depends on the application requirements and on the effect on developing conditions. In general, it is no more than about 50% by weight. Contents of from about 2 to 35% by weight, relative to the quantity of non-volatile constituents of the layer, are preferable. The light-sensitive layer can also contain substances such as polyglycols, cellulose ethers, for example ethylcellulose, wetting agents and finely divided pigments, in small amounts for special requirements, such as flexibility, adhesion, gloss and the like.

Finally, soluble or also finely divided dispersible dyestuffs can be added to the light-sensitive mixture as well as UV absorbers, depending on the intended use. Triphenylmethane dyestuffs, in particular in the form of their carbinol bases, have been found to be particularly suitable for use as dyestuffs.

Preferably supports for layers which are more than 10 μm thick are plastic films, which then serve as temporary supports for transfer layers. Polyester films are preferred for this purpose and for color proofing films. Metals are usually used as supports for layers which are less than about 10 μm thick. Mechanically or electrochemically roughened aluminum, which is optionally anodized and/or also chemically pretreated (for example, with polyvinylphosphonic acid, silicates or phosphates) and multimetal plates containing Cu/Cr or brass/Cr as the uppermost layer can be used for offset printing plates. To obtain letterpress plates, the layers according to the invention can be applied to zinc or magnesium plates and to their commercially available microcrystalline alloys for powderless etching, and to etchable plastics such as polyoxymethylene. To obtain gravure forms or screens, the layers according to the invention are suitably applied to copper or nickel surfaces by virtue of their firm adhesion and etch resistance. The mixtures according to the invention can also be used as photoresists.

The coating can be effected directly or by dry layer transfer from the temporary support onto printed circuit board materials, which consist of insulating boards bearing a layer of copper on one or both sides, or onto glass or ceramic materials which may be pretreated in an adhesion-promoting manner or onto silicon, silicon oxide or silicon nitride discs.

Customary equipment and conditions can be adopted for the drying after the coating, whereby temperatures of about 100° C. and briefly up to 120° C. can be withstood without loss of radiation sensitivity.

The imagewise exposure can be carried out with customary copying equipment, such as fluorescent tubes, pulsed xenon lamps, metal halide doped high-pressure mercury vapor lamps and carbon arc lamps. Exposure can also be effected using the coherent light of a laser. For the purposes of the present invention, short-wave lasers of suitable power, for example argon lasers, crypton ion lasers, dye lasers and helium cadmium lasers which emit between 300 and 600 nm are suitable. The laser beam is controlled by means of a predetermined programmed line and/or screen movement.

Irradiation with electron beams is a further imaging possibility. In this case, acid donors which show little or no sensitivity toward daylight can also be used.

After the imagewise irradiation or exposure, the material is warmed without further intermediate treatment. The warming can be effected by irradiation, convection, by contact with heated surfaces, for example, rolls, or by dipping into a warmed bath of an inert liquid, for example, water. The temperature can be between about 80° and 150° C., preferably from about 100° to 130° C. Such temperatures are withstood by the mixtures without the properties of the unexposed areas changing significantly. The heating time can vary very widely depending on the kind of heat treatment. If heat is transferred via a medium, the time is generally between about 5 and 30 minutes, preferably between about 5 and 20 minutes. If continuous infra-red equipment is used, dwell times as low as from about 1 to 2 minutes can be adequate for thin layers.

After the heating and subsequent cooling down, the light-sensitive layer is subjected to a total exposure in order to convert completely the light-sensitive areas of the layer still present into their light decomposition products. The afterexposure can advantageously be carried out under the same light source as was used for the imagewise exposure.

The afterexposure is followed by developing with customary developers, during which those areas of the layer are washed out which were not hit by the light in the original imagewise exposure. Suitable developers are preferably aqueous solutions of alkaline substances, for example, alkali metal phosphates, silicates, carbonates or hydroxides, which can also contain wetting agents or minor amounts of organic solvents. In certain cases, organic solvents or mixtures thereof with water are also suitable for use as developers. The developing can be carried out immediately after the heating and cooling or also after an interval of, for example, several hours, without the hardened areas of the layer being attacked. From this fact it can be inferred that hardening of the exposed areas by warming is irreversible.

The process according to the invention has the advantage that it requires neither additional treatment steps with liquids nor a special composition of the light-sensitive material. It is thus possible to prepare positive or negative copies, as desired, using customary positive materials based on acid-cleavable compounds. The single additional treatment step, namely the heating, can usually be carried out in a convenient way using existing drying equipment. The afterexposure without the original is most simply carried out by again using the copying light source.

The process enables the known high image resolution of positive materials to also be used for preparing negative copies. A further advantage over the known reverse methods, which are carried out by means of positive materials based on o-quinonediazides, is the high light sensitivity of the materials used in the process according to the invention. Thus, it is even possible to obtain negative copies having a high resolution and a thick layer.

Since the light reaction in the light-sensitive mixtures used in the process according to the invention is based on a mechanism which is completely different from that of o-quinonediazide layers, it was not to be expected that the acid-cleavable mixtures could be processed in a similar way to give a negative image. In particular, it was not to be expected that these mixtures could produce an equally good result, using simpler process steps.

The process according to the invention can be used for preparing printing forms for letterpress, gravure and planographic printing and photoresist stencils for the subtractive and additive manufacture of printed circuit boards, for electroplating nickel rotary cylinders or for preparing masks in microelectronics using the lift-off technique. If the resist stencil is intended to remain on a circuit, the resist stencil is distinguished from an identical stencil prepared by the positive method by better dielectrical values. Even as a planographic form, the negative-processed, exposed and heated layers produce longer print runs than the same layers after processing by positive copy.

The Examples which follow describe preferred embodiments of the process according to the invention. Unless otherwise stated, percentages and quantitative ratios are to be understood as meaning units by weight.

EXAMPLE 1

A coating solution of
7 parts by weight of a cresol/formaldehyde novolak having a softening range of 105°–120° C. as determined by the DIN 53,181 capillary method,
2 parts by weight of 2-naphth-2-yloxy-5,5-dimethyl-oxazol-4-one,
0.1 part by weight of 2-(4-ethoxynaphth-1-yl)-4,6-bis-trichloromethyl-s-triazine, and
0.1 part by weight of 4-diethylaminoazobenzene in
90.8 parts by weight of a solvent mixture of ethylene glycol monoethyl ether and butyl acetate (4:1)

was applied to an aluminum plate, which was mechanically roughened on one side by wire brushes, and dried. The thickness of the layer obtained corresponded to a weight of 2 g/m$^2$.

After the drying, the layer was exposed under a positive original, developed with a 3.5% strength solution of trisodium phosphate which had been adjusted to a pH of 12.6 by adding sodium hydroxide, rinsed with water and finally made ready for printing by wiping with 1% strength phosphoric acid.

Another sample of the same material was processed as a negative printing plate by exposing under a negative original, then heating for 10 minutes at 100° C. and afterexposing without an original for the same time or longer. Upon developing in the same developer for the same time, the reverse image of the original was produced, and was then also treated with printing ink for printing. The reverse plates thus treated produced, on the average, an offset printing machine print run which was about 20% higher, compared to the positive plate.

Similar results were obtained if the same amount of 2-(4-benzyloxyphenoxy)-8-methyl-1,3-benzoxazin-4-one was used as the cleavable compound in place of the oxazolone mentioned.

EXAMPLE 2

To prepare a positive dry resist for etching and electroplating conditions, the following solution was prepared:
- 61.2 parts by weight of methyl ethyl ketone,
- 20 parts by weight of the novolak indicated in Example 1,
- 10 parts by weight of the reaction product of 187 parts by weight of phenol/formaldehyde novolak (melting range 110–120° C., in accordance with DIN 53,181) and 6.56 parts by weight of the addition product of 3 moles of toluene diisocyanate and 1 mole of trimethylolpropane,
- 4.5 parts by weight of the bis-(5-ethyl-5-methoxymethyl-1,3-dioxolan-2-yl) ether of 2-ethyl-2-methoxymethyl-1,3-propanediol,
- 4.0 parts by weight of 1,3-bis-(3,4-dihydronaphth-2-yl-oxy)-propane,
- 0.2 part by weight of 2-(6-methoxynaphth-2-yl)-4,6-bis-trichloromethyl-s-triazine, and
- 0.05 part by weight of crystal violet base.

A biaxially stretched and heatset 25 $\mu$m thick polyethylene terephthalate film was coated with this solution, dried and laminated with a 12 $\mu$m thick polypropylene top film in such a way that an evenly thick resist layer was formed between the two films.

After the top films had been peeled off, two of these resist films were laminated in a commercially available laminator under pressure and heat onto both sides of a bright-rolled brass plate for manufacturing contact springs for switches. After cooling down, peeling off of the support films and a brief further drying in a drying cabinet at 80° C., the coated metal sheet was exposed once positively and once negatively on both sides using an exactly in-register pair of originals in the shape of a bag. The negatively exposed plate was heated for about 10 minutes at 130° C. in a continuous oven having IR radiators, afterexposed on both sides without the original after cooling down, and after a short time interval developed concurrently with the positive-exposed plate in spray developing equipment, which was filled with a developer solution of
- 2.67 parts by weight of sodium metasilicate 9 $H_2O$,
- 1.71 parts by weight of trisodium phosphate 12 $H_2O$ and
- 0.17 part by weight of monosodium phosphate in
- 95.45 parts by weight of completely demineralized water.

The two plates of identical appearance were rinsed down to remove alkaline developer residues and were then etched on both sides using commercially available ferric chloride solution until they had been etched through to smooth sides.

The switch components thus obtained were completely identical in respect of width and edge quality of the spring strips, confirming the copying quality and etch resistance of the reverse layer by comparison to the directly positive-processed positive layer.

EXAMPLE 3

To prepare microelectronic switching elements of high packing density, commercial, customarily manufactured polished silicon discs oxidized at the surface to give a 0.2 $\mu$m thick $SiO_2$ layer were coated with the following positive photoresist solution.
- 19 parts by weight of the novolak indicated in Example 1,
- 9.5 parts by weight of triethylene glycol bis-diphenoxy-methyl ether,
- 0.2 part by weight of 2-(4-ethoxynaphth-1-yl)-4,6-bis-trichloromethyl-s-triazine, and
- 1.3 parts by weight of low-viscosity polyethyl acrylate (Plexisol B 574)

were dissolved in 70 parts by weight of a solvent mixture of ethylene glycol ethyl ether acetate, butyl acetate and xylene (8:1:1), and the solution was filtered through a 0.5 $\mu$m filter. Spin-coating with this solution at 9,000 rpm produced approximately 1.2 $\mu$m thick resist layers, which were then dried for 10 minutes at 90° C. in a circulating air cabinet. After cooling down and conditioning to the room conditions defined, exposure took place in a wafer contact exposure device for 1 second using a 200 watt Hg high pressure lamp under a commercially available chromium mask with highly resolved test areas. Developing took place at 25° C. for 1 minute in an agitated solution of the developer, which was mentioned in Example 2 but which had been diluted 1:1 with completely demineralized water. A positive image of the original was obtained.

A further sample of the light-sensitive material was heated for 30 minutes at 120° C. after the imagewise exposure under the corresponding reversed chromium mask, afterexposed without the original and then developed in the same way as above. A similar resist mask was obtained which is equally suitable for microlithographic processes, such as $SiO_2$ etching or doping uses. The further heating before developing increased the etch resistance without the developed resist profiles being changed by the heat treatment (no postbake flow). It is also possible by means of this reverse process to utilize the advantages of the higher resolution and sharper resist edges achieved in the case of the positive resist material, compared to the customary negative microresist which is processed with organic solvents.

EXAMPLE 4

An aluminum plate of electrolytically roughened and anodized aluminum was provided with a
- 2.2 $\mu$m thick layer of
- 2 parts by weight of the novolak of Example 1,
- 0.4 part by weight of a polymeric orthocarboxylate of trimethyl orthoformate and 1,2,6-hexanetriol,
- 0.13 part by weight of the s-triazine indicated in Example 2, and
- 0.007 part by weight of crystal violet base.

This layer was imagewise irradiated in a laser exposure device (LASERITE 150 R from Eocom Corp., U.S.A.) with an argon ion laser at 6 mj/cm². The sensitivity of layer variants was determined by varying the writing speed. The exposed parts of the layer were removed within 2 minutes using a developer composed of
- 5.5 parts by weight of sodium metasilicate 9 $H_2O$,
- 3.4 parts by weight of trisodium phosphate 12 $H_2O$,
- 0.4 part by weight of monosodium phosphate (anhydrous) and
- 90.7 parts by weight of completely demineralized water.

By coloring the non-irradiated areas with fatty ink, the laser trace can be shown up even more clearly.

Reverse processing was carried out with an identical plate by heating the plate to at least 90° C. in a customary continuous infra-red heating device after the laser irradiation, then afterexposing under a copying lamp over the entire area and, finally, developing in the same way as the positive plate.

EXAMPLE 5

This Example demonstrates how nickel rotary stencils for textile printing can be prepared with the following photoresist solution by electroplating. A solution was prepared of

- 40 parts by weight of methyl ethyl ketone,
- 15 parts by weight of ethylene glycol ethyl ether acetate,
- 5 parts by weight of diethylene glycol monoethyl ether,
- 28 parts by weight of the novolak of Example 1,
- 3.5 parts by weight of polyvinyl ethyl ether (Lutonal A 25),
- 8.3 parts by weight of the polyacetal of 2-ethyl-butyraldehyde and triethylene glycol,
- 0.2 part by weight of 2-(6-methoxynaphth-2-yl)-4,6-bis-trichloromethyl-s-triazine, and
- 0.01 part by weight of crystal violet base.

A 75 μm thick layer of good surface quality was applied by two-fold spray coating with intemediate drying to a bright-rolled, slightly elastically expandible nickel cylinder which had been provided with a conductive release layer. The cylinder, rotating during this process, was then sufficiently dried for about 30 minutes under infra-red radiators.

Exposure took place for a sufficiently long time under a positive of the motif to be printed, the tonal gradations of which had been converted by means of a screen of 32 lines/cm into image areas of differing hiding power. The exposure time was 6 times as long for a positive layer which was half as thick and based on o-naphthoquinonediazide. A solution of

- 0.5% of NaOH,
- 0.8% of sodium metasilicate 9 H$_2$O, and
- 1.0% of ethylene glycol mono-n-butyl ether in
- 97.7% of completely demineralized water was used for developing. For this purpose, the rotating exposed cylinder was dipped into a trough which had a corresponding size and was half-filled with the developer. The developer resistance of the layer was very good, and made possible steep sides of the resist edges. When the cylinder had rotated in the developer for 6 minutes, the developer trough was removed and the cylinder was rinsed with water and dried in air.

Nickel up to a thickness of 0.1 mm was electro-coated at the bared areas of the cylinder core. After the cylinder core had been shrunk and the resist stencil had been stripped with acetone and the nickel stencil had been removed from the core, a resilient rotary stencil printing form was obtained. The ink was transferred imagewise through the holes of the rotary stencil onto the textile materials to be printed. The range of tone which is possible is increased compared to stencils based on diazo layers and negative resists, since the relatively thick layer is safer in preventing the narrowing of relatively small image points, i.e. relatively small holes, during electrolytic nickel plating.

The same resist layer can be used analogously as a reverse layer when a negative film is used as an original. Since there are no negative resists on the market which can be processed to give a correspondingly thick layer and the re-copying of silver films with a large area is expensive, the negative processing of this highly sensitive positive resist recommends itself. For this purpose, the all-round exposure under the negative film was followed by an additional heating stage for a further 30 minutes under the existing infra-red radiators, and the cylinder was afterexposed under the light source without the original. The final result was a nickel printing cylinder which was identical to that obtained in the positive procedure.

Similar results were obtained when the polyacetal of n-heptanal and tetraethylene glycol was used as the cleavable compound.

EXAMPLE 6

This Example demonstrates how the direct positive and reverse negative processes are combined for the manufacture of micro-printed circuit boards. For this purpose, a positive dry resist film was prepared similarly to Example 2, with a resist layer of 12 μm thickness and the following composition:

- 64 parts by weight of the novolak of Example 1,
- 11 parts by weight of polyvinyl methyl ether (Lutonal M 40),
- 15 parts by weight of the polyacetal of 2-ethyl-butyraldehyde and hexane-1,6-diol,
- 9.5 parts by weight of the polyortho-ester of trimethoxymethane and 5-oxa-7,7-dihydroxy-methylnonan-1-ol,
- 0.4 part by weight of 2-acenaphth-5-yl-4,6-bis-trichloromethyl-s-triazine, and
- 0.1 part by weight of crystal violet base.

In a commercially available laminator, this resist film was applied under pressure and heat to through-hole copper-clad boards of insulating material, and allowed to cool down, after which the support film was peeled off. Whether the resist film covers the holes during this step (tenting) or tears, is immaterial in this favorable process, since the eyelets are bared in any event in this first process step. A negative original, where only the hole regions were transparent, was used for this purpose. A double was used of the negative conducting path original, where the conducting paths had been retouched away, i.e., covered over.

After exposure of the eyelets, these regions were developed, i.e., washed out, using the same developer as in Example 4. Before the reinforcement by electroplating and tinning or Pb/Sn deposition in the zone on the eyelets, the negative conducting path original was used for exposure, but was not followed by developing.

The hole region was reinforced by electroplating. The coated board was then heat-treated for 20 minutes at 110° C., afterexposed over the whole area and only then developed. The bared copper was then etched away in an ammoniacal etching bath, a Cu microconductor circuit being obtained which had the following advantages: resolution to a conducting path width of less than 50 μm, two copying steps with one single coating, use of virtually only one (negative) original and equipment which was already present.

If the second copying step is not carried out as described using the reverse process, but instead in the positive process, heat treatment and afterexposure are admittedly eliminated; but in addition, a positive film of the conducting path original is necessary. An advantage of the two process variants is that the second copy is not impaired by the electroplating process, and this prevents the copy of the conducting paths from having to take place unevenly over the hole regions already reinforced by electroplating.

EXAMPLE 7

A positive photoresist solution of
52 parts by weight of butanone,
34 parts by weight of the novolak of Example 1,
9 parts by weight of 1,3-bis-(5-butyl-5-ethyl-1,3-dioxan-2-yloxy)-2-butyl-2-ethylpropane,
4.8 parts by weight of the polyethyl acrylate of Example 3,
0.18 part by weight of 2-(4-ethoxynaphth-1-yl)-4,6-bis-trichloromethyl-s-triazine, and
0.02 part by weight of crystal violet base was applied on a printed circuit board support to give a dry layer weight of 3.9 g/m². After drying for 5 minutes at 100° C., the coated supports were irradiated for 5 seconds with 11 keV at 5 μA in an electron beam exposure device, heated for a further 15 minutes at 100° C., afterexposed without the original under UV light and developed for 30 seconds as in Example 5. This produced a sharp resist image which it was possible to use for etching the support material at the bared non-irradiated areas.

Similar results were obtained when the polyorthoester of Example 6 was used as the cleavable compound and a heat treatment was carried out for 30 minutes at 100° C.

The negative processing of the positive layer is possible at an incident energy of $5 \times 10^{-2}$ joule/cm² to $250 \times 10^{-2}$ joule/cm². The practical electron beam sensitivity can be improved still further by optimizing time and temperature of the post-heating stage.

When the positive method is used, i.e., irradiation with electron beams and subsequent removal of the irradiated areas using the same developer for 30 seconds, this requires, on the other hand, minimum energies of $55 \times 10^{-2}$ to $80 \times 10^{-2}$ joule/cm².

What is claimed is:

1. A process for preparing relief images, comprising the steps of:
    imagewise irradiating a light-sensitive material comprised of a support and a light-sensitive layer which consists essentially of
    (a) a compound which has at least one C—O—C bond which is cleavable by acid;
    (b) a compound which forms a strong acid on irradiation, and
    (c) a binder which is insoluble in water and soluble in aqueous-alkaline solutions to produce imaged and non-imaged areas;
    warming the irradiated material in heated air to an elevated temperature sufficient to render the imaged areas resistant to developing;
    bringing the material to a lower temperature;
    uniformly irradiating the entire area of the layer; and
    selectively developing the non-imaged areas from the imagewise irradiating step.

2. A process as claimed in claim 1, wherein the material is warmed to a temperature of from about 80° to 150° C.

3. A process as claimed in claim 1, wherein the material is warmed for a period of from about 1 to 30 minutes.

4. A process as claimed in claim 1, wherein said acid-cleavable compound (a) comprises an orthocarboxylic acid derivative, an acetal, an enol-ether or an N-acyliminocarbonate.

5. A process as claimed in claim 1, wherein said binder (c) comprises a novolak.

6. A process as claimed in claim 1, wherein the light-sensitive layer further comprises at least one resin having solubility properties which differ from those of the binder (c).

7. A process as claimed in claim 1, wherein the developing step comprises applying an aqueous-alkaline developer solution.

8. A process for preparing relief images, comprising the steps of:
    imagewise irradiating, according to a first pattern, a light-sensitive material comprised of a support and a light-sensitive layer which consists essentially of
    (a) a compound which has at least one C—O—C bond which is cleavable by acid,
    (b) a compound which forms a strong acid on irradiation, and
    (c) a binder which is soluble in water and soluble in aqueous-alkaline solutions, developing the irradiated layer to produce bared areas in the regions of irradiation;
    modifying said bared areas to provide a metal surface;
    before or after said modification, imagewise irradiating the remaining areas of the layer according to a second pattern;
    warming the irradiated material in heated air to an elevated temperature sufficient to render the imaged areas resistant to developing;
    bringing the material to a lower temperature;
    uniformly irradiating said remaining layer areas; and
    after said modification, developing said remaining layer areas to remove the non-irradiated areas of said second imagewise irradiation.

9. A process as claimed in claim 8, wherein said pattern used in the first imagewise irradiation comprises the pattern for the second imagewise irradiation, which is partially covered.

10. A process as claimed in claim 2, wherein said temperature is between about 100° and about 130° C.

* * * * *